United States Patent
Do

(10) Patent No.: US 12,411,427 B2
(45) Date of Patent: Sep. 9, 2025

(54) SHUTTER APPARATUS AND SUBSTRATE TREATING APPARATUS INCLUDING THE SAME

(71) Applicant: SEMES CO., LTD., Cheonan-si (KR)

(72) Inventor: Wan Ho Do, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 703 days.

(21) Appl. No.: 17/467,949

(22) Filed: Sep. 7, 2021

(65) Prior Publication Data
US 2022/0075281 A1 Mar. 10, 2022

(30) Foreign Application Priority Data
Sep. 10, 2020 (KR) ........................ 10-2020-0115861

(51) Int. Cl.
| | |
|---|---|
| *G03F 7/00* | (2006.01) |
| *F15B 15/20* | (2006.01) |
| *F27B 17/00* | (2006.01) |
| *F27B 17/02* | (2006.01) |
| *F27D 1/18* | (2006.01) |
| *G03F 7/16* | (2006.01) |

(52) U.S. Cl.
CPC .......... *G03F 7/70991* (2013.01); *F15B 15/20* (2013.01); *F27B 17/0025* (2013.01); *F27B 17/02* (2013.01); *F27D 1/1858* (2013.01); *G03F 7/168* (2013.01)

(58) Field of Classification Search
USPC ........................................................ 92/85 R
See application file for complete search history.

(56) References Cited

U.S. PATENT DOCUMENTS 6,113,734 A * 9/2000 Woo ........................ F27B 17/02
156/345.24

FOREIGN PATENT DOCUMENTS

| | | | |
|---|---|---|---|
| GB | 991886 A | * | 5/1965 |
| JP | 2001-248606 A | | 9/2001 |
| KR | 10-1998-0065413 A | | 10/1998 |
| KR | 10-0871670 | | 12/2008 |
| KR | 10-2009-0055769 A | | 6/2009 |

(Continued)

OTHER PUBLICATIONS

Rowse_Pneumatics_what_is_pneumatic_cylinder_cushioning.pdf (Year: 2019).*

(Continued)

*Primary Examiner* — Steven S Anderson, II
*Assistant Examiner* — Kurt J Wolford
(74) *Attorney, Agent, or Firm* — Harness, Dickey & Pierce, P.L.C.

(57) ABSTRACT

Disclosed is a substrate treating apparatus. The substrate treating apparatus includes a process chamber having an opening, a shutter that opens and closes the opening through a rotation thereof, and a shutter driver having a cylinder that opens and closes the shutter, and the shutter driver includes a controller that controls a pneumatic pressure provided to the cylinder such that, when the shutter is rotated from an opening location to a closing location, a rotational speed of the shutter in a first rotation section including the opening location and a rotational speed of the shutter in a second rotation section including the closing location are different.

16 Claims, 6 Drawing Sheets

(56) References Cited

FOREIGN PATENT DOCUMENTS

| | | |
|---|---|---|
| KR | 10-2016-0063826 A | 6/2016 |
| KR | 10-2016-0106413 A | 9/2016 |

OTHER PUBLICATIONS

Womack_cushioning_and_decelerating_methods_for_cylinders. pdf (Year: 1988).*
Korean Office Action dated Jun. 8, 2023 issued in corresponding Korean Patent Application No. 10-2020-0115861.

* cited by examiner

SHUTTER APPARATUS AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2020-0115861 filed on Sep. 10, 2020, in the Korean Intellectual Property Office, the entire contents of which are hereby incorporated by reference.

BACKGROUND

Embodiments of the inventive concept described herein relate to a substrate treating apparatus, and more particularly, to a shutter apparatus that opens and closes an entrance, through which a substrate is carried in and out, and a substrate treating apparatus including the same.

In recent years, a liquid crystal display (LCD) element, a plasma display panel (PDP) element, and the like have been used for manufacturing an image display device, and a substrate of a flat panel display (FPD) is used.

In a process of manufacturing a flat panel display, many processes such as a substrate manufacturing process, a cell manufacturing process, a module manufacturing process, and the like are performed. In particular, the substrate manufacturing process requires a photographing process for forming various patterns on a substrate. In the photographing process, a deposition process of depositing a photosensitive liquid such as photoresist on a substrate, an exposure process of forming a specific pattern on the deposited photosensitive film, and a development process of developing an area corresponding to the exposed photosensitive film are sequentially performed. A baking process that heat-treats the substrate is performed before and after, among them, the deposition process and the development process.

A general baking unit is provided with a chamber that provides a space for performing a baking process, in an interior thereof, and a shutter apparatus that opens and closes an entrance, through which a substrate is carried in and out, on one side of the chamber.

Among the elements of an existing shutter apparatus, a rotary cylinder that causes a backlash is designed by a designer such that a gap is adjusted during assembly thereof in spite of distortion of +1° due to the basic principle characteristics that the cylinder is operated by a rack-pinion structure. The rotary cylinder is driven by using a positive pressure of a solenoid valve, and a location error becomes larger due to a radius of rotation thereof unlike an error in a linear movement in spite of distortion of 1° due to the backlash of the rack gear.

The effect of the baking process is maximized only when a gap of 3 mm is maintained between the chamber and the shutter in the baking unit, and particles are generated due to an interference with the chamber and repeated impacts when the gap between the chamber and the shutter becomes 0 due to the shaking caused by the backlash, which are the main cause of the particle defects on a surface of glass.

SUMMARY

Embodiments of the inventive concept provide a substrate treating apparatus that may prevent a backlash phenomenon during an operation of a shutter, and a shutter apparatus.

The technical objectives of the inventive concept are not limited to the above-mentioned ones, and the other unmentioned technical objects will become apparent to those skilled in the art from the following description.

According to an embodiment, a substrate treating apparatus includes a process chamber having an opening, a shutter that opens and closes the opening through a rotation thereof, and a shutter driver having a cylinder that opens and closes the shutter, and the shutter driver includes a controller that controls a pneumatic pressure provided to the cylinder such that, when the shutter is rotated from an opening location to a closing location, a rotational speed of the shutter in a first rotation section including the opening location and a rotational speed of the shutter in a second rotation section including the closing location are different.

Furthermore, the first rotation section may have a rotation section that is larger than the second rotation section.

Furthermore, the rotational speed of the shutter in the second rotation section may be lower than the rotational speed of the shutter in the first rotation section.

Furthermore, the shutter driver may include the cylinder, a first pneumatic pressure line that provides a positive pressure for closing the shutter to the cylinder, a second pneumatic pressure line that provides a back pressure for opening the shutter to the cylinder, a first valve provided in the first pneumatic pressure line, a second valve provided in the second pneumatic pressure line, and the controller that controls the first valve and the second valve.

Furthermore, the controller may control the second valve to provide the back pressure to the cylinder through the second pneumatic pressure line when the shutter enters the second rotation section.

Furthermore, the shutter driver may further include a regulator installed in the second pneumatic pressure line.

Furthermore, the regulator may be configured such that the back pressure supplied to a back pressure chamber is lower than the positive pressure supplied to a positive pressure chamber.

According to an embodiment, a substrate treating apparatus includes a process chamber having an opening, a shutter that opens and closes the opening through a rotation thereof, and a shutter driver having a cylinder that opens and closes the shutter, and the shutter driver may further include a cylinder having a positive pressure chamber accommodating a piston such that the piston is moved forwards and rearwards in an axial direction thereof, formed on one side of the piston, and through which a pneumatic pressure for closing the shutter is introduced, and a back pressure chamber formed on an opposite side thereof and through which a pneumatic pressure for opening the shutter is introduced, a first pneumatic pressure line that provides a positive pressure for closing the shutter to the positive pressure chamber, a second pneumatic pressure line that provides a back pressure for opening the shutter to the back pressure chamber, a first valve provided in the first pneumatic pressure line, a second valve provided in the second pneumatic pressure line, and a controller that controls the first and second valves such that the positive pressure and the back pressure are provided together during closing operation of the shutter.

Furthermore, the shutter driver may further include a regulator installed in the second pneumatic pressure line.

Furthermore, the controller may control the first valve such that the positive pressure is supplied to the positive pressure chamber for the closing operation of the shutter, and may control the second valve such that the back pressure is supplied to the back pressure chamber after a specific period of time.

Furthermore, a period of time, for which the positive pressure and the back pressure are simultaneously provided to the cylinder during the closing operation of the shutter, may be shorter than a period of time, for which only the positive pressure is provided to the cylinder.

Furthermore, the controller may control the first valve such that a pneumatic pressure is supplied to the positive pressure chamber for the closing operation of the shutter, and may control the second valve such that a pneumatic pressure is supplied to the back pressure chamber when the shutter is located at a specific angle.

Furthermore, a range, in which the shutter is rotated for a period of time, for which the positive pressure and the back pressure are simultaneously provided to the cylinder during the closing operation of the shutter, may be shorter than a range, in which the shutter is rotated for a period of time, for which only the positive pressure is provided to the cylinder.

Furthermore, the controller may control the positive pressure and the back pressure to be supplied to the cylinder such that, when the shutter is rotated from an opening location to a closing location, a rotational speed of the shutter in a first rotation section including the opening location is higher than a rotational speed of the shutter in a second rotation section including the closing location.

Furthermore, the controller may control the first valve and the second valve such that only the positive pressure is provided in the first rotation section and the positive pressure and the back pressure are simultaneously provided in the second rotation section.

Furthermore, the back pressure supplied to the back pressure chamber may be lower than the positive pressure supplied to the positive pressure chamber.

According to an embodiment, a shutter apparatus includes a shutter that opens and closes an opening through a rotation thereof, and a shutter driver having a cylinder that opens and closes the shutter, and the shutter driver further includes a cylinder having a positive pressure chamber accommodating a piston such that the piston is moved forwards and rearwards in an axial direction thereof, formed on one side of the piston, and through which a pneumatic pressure for closing the shutter is introduced, and a back pressure chamber formed on an opposite side thereof and through which a pneumatic pressure for opening the shutter is introduced, a first pneumatic pressure line that provides a positive pressure for closing the shutter to the positive pressure chamber, a second pneumatic pressure line that provides a back pressure for opening the shutter to the back pressure chamber, a first valve provided in the first pneumatic pressure line, a second valve provided in the second pneumatic pressure line, a regulator provided in the second pneumatic pressure line, and a controller that controls the first and second valves such that the positive pressure and the back pressure are provided together during closing operation of the shutter.

Furthermore, the controller may control the first valve and the second valve such that only the positive pressure is provided at an initial stage for the closing operation of the shutter, and thereafter, the positive pressure and the back pressure are provided simultaneously.

Furthermore, the controller may control the first valve and the second valve such that a period of time, for which the positive pressure and the back pressure are simultaneously provided to the cylinder, is shorter than a period of time, for which only the positive pressure is provided to the cylinder.

Furthermore, the regulator may be configured such that the back pressure supplied to the back pressure chamber is lower than the positive pressure supplied to the positive pressure chamber.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for an ordinary person skilled in the art more completely. Accordingly, the shapes of the components of the drawings are exaggerated to emphasize clearer description thereof.

A baking apparatus used for a photolithographic facility will be described as an example in the embodiment of the inventive concept.

In the embodiment, a substrate is adapted to manufacture a flat panel display (hereinafter, an 'FPD'), and the FPD may be a liquid crystal display (LCD), a plasma display (PDP), a vacuum fluorescent display (VFD), a field emission display (FED), an electro luminescence display (ELD).

The substrate treating apparatus according to the inventive concept is a baking apparatus used to heat or cool a substrate in a photolithographic process.

Figure 1:
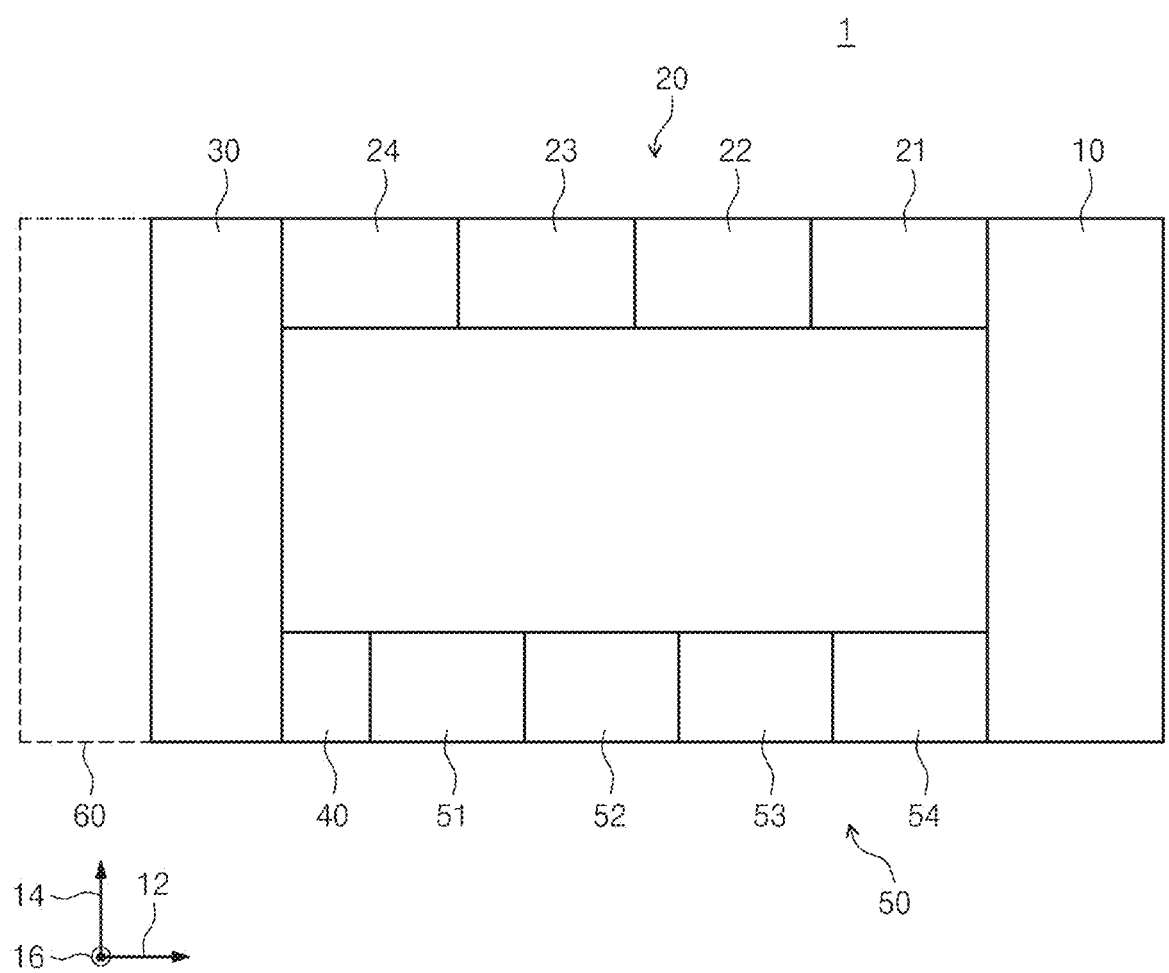
FIG. 1 is a diagram of a facility for a photolithographic process according to the inventive concept.

As illustrated in FIG. 1, a facility 1 for a photolithographic process may include an index module 10, a deposition module 20, an interface module 30, an edge exposure apparatus 40, a liquid treatment module 50, and an exposure module 60.

A substrate "W" is introduced into or discharged from the index module 10. A lengthwise direction of the index module 10 is disposed along a second direction 14. Here, the second direction 14 is a direction, in which the index module 10 is disposed. A direction that is perpendicular to the second direction 14 when viewed from a top is referred to as a first direction 12. A direction that is perpendicular to both the first direction 12 and the second direction 14 is referred to as a third direction 16.

As an example, the index module 10 may introduce or discharge the substrate "W" through a transfer roller that transfers the substrate "W" or a separate feeding robot.

The deposition module 20 performs a deposition process on the substrate "W". The deposition module 20 is provided adjacent to one side of the index module 10. A lengthwise direction of the deposition module 20 is disposed along the first direction 12. The deposition module 20 may include a cleaning unit 21, a deposition unit 22, a vacuum drying unit 23, and a baking unit 100. In the deposition module 20, a cleaning process, a deposition process, a vacuum drying process (VCD), and a baking process may be sequentially performed. The cleaning unit 21 cleans the substrate "W" before the deposition process for the substrate "W" is performed. The cleaning unit 21 performs a process by supplying a cleaning liquid to the substrate "W". As an example, the cleaning unit 21 may supply the cleaning liquid with a cleaning liquid supply unit provided above the substrate "W". For example, the cleaning liquid may be pure water.

The deposition unit 22 performs a deposition process on the substrate "W". The substrate "W", on which the deposition process has been completed, is moved to the vacuum drying unit. The vacuum drying unit 23 performs a process of removing and drying an organic solvent included in photoresist (hereinafter, briefly referred to as PR) at the same time.

The baking unit 100 performs a baking process on the substrate "W". As an example, in the baking process, the substrate "W" may be heated with a heating unit installed below the substrate "W".

The substrate "W", on which the deposition module 20 has performed the process, is moved to the interface module 30. The interface module 30 transfers the substrate "W" to the deposition module 20, the liquid treatment module 50, and the exposure module 60. The interface module 30 is disposed to be adjacent to the deposition module 20 and the liquid treatment module 50. The interface module 30 is disposed in parallel to the index module 10. A lengthwise direction of the interface module 30 is disposed along the second direction 14. When the substrate "W" is transferred in the interface module 30, it may be transferred by using the feeding robot.

The edge exposure apparatus 40 performs an edge exposure process of irradiating light to an edge area of the substrate "W". The edge exposure apparatus 40 is disposed between the interface module 30 and the liquid treatment module 50. Unlike this, the edge exposure apparatus 40 may be disposed in the deposition module 20 and the interface module 30.

The exposure module 60 performs an exposure process on the substrate "W". The exposure module 60 is provided adjacent to one side of the interface module 30.

The liquid treatment module 50 may be a development module that performs a development process on the substrate "W". The index module 10 is disposed adjacent to one side of the liquid treatment module 50. The liquid treatment module 50 is parallel to the deposition module 20, and a lengthwise direction of the liquid treatment module 50 is disposed along the first direction 12.

The liquid treatment module 50 includes a liquid treatment unit 51, a rinsing unit 52, a drying unit 53, and an inspector 54. According to the liquid treatment module 50, after the liquid treatment unit 51 performs a liquid treatment process and then the rinsing unit 52 and the drying unit 53 perform a cleaning process and a drying process, the inspector 54 performs an inspection. As an example, the liquid treatment process is a development process.

Figure 2:
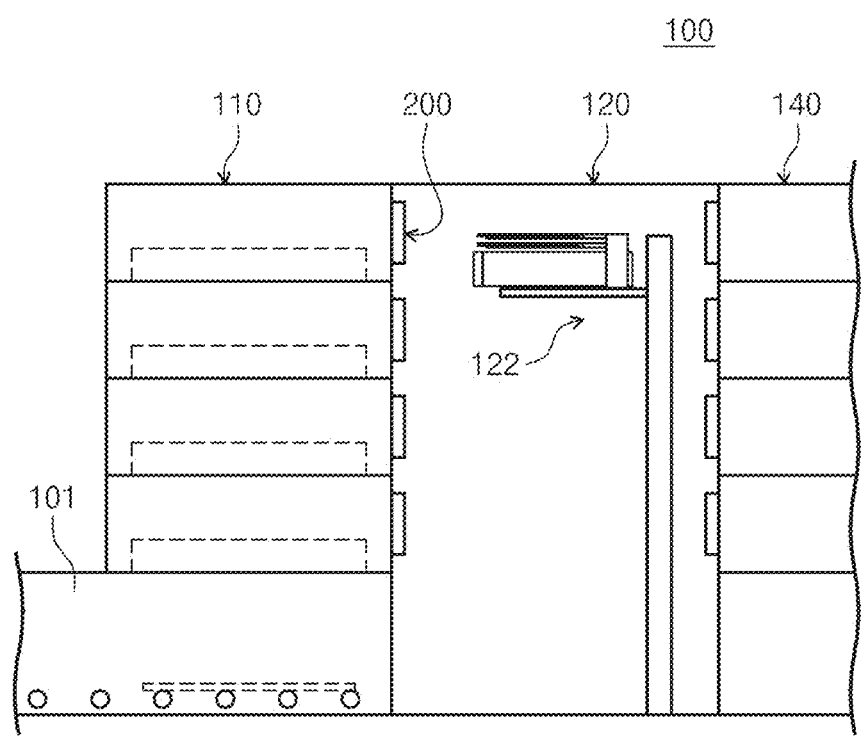
FIG. 2 is a view schematically illustrating a configuration of a baking unit.

FIG. 2 is a view schematically illustrating a configuration of a baking unit.

Referring to FIG. 2, the baking unit 100 may include a baking chamber 110 and a transfer chamber 120.

A plurality of baking chambers 110 may be stacked in a vertical direction. Each of the baking chambers 110 may include a shutter apparatus 200 that opens and closes an opening (illustrated in FIG. 4) for carrying the substrate in and out.

The transfer chamber 120 may be provided with a transfer robot 122 for transferring the substrate. The transfer robot 122 transfers the substrate transferred through a conveyor transfer passage 101 to the baking chamber 110, or transfers the substrate heat-treated in the baking chamber 110 to a cooling chamber 140.

Figure 3:
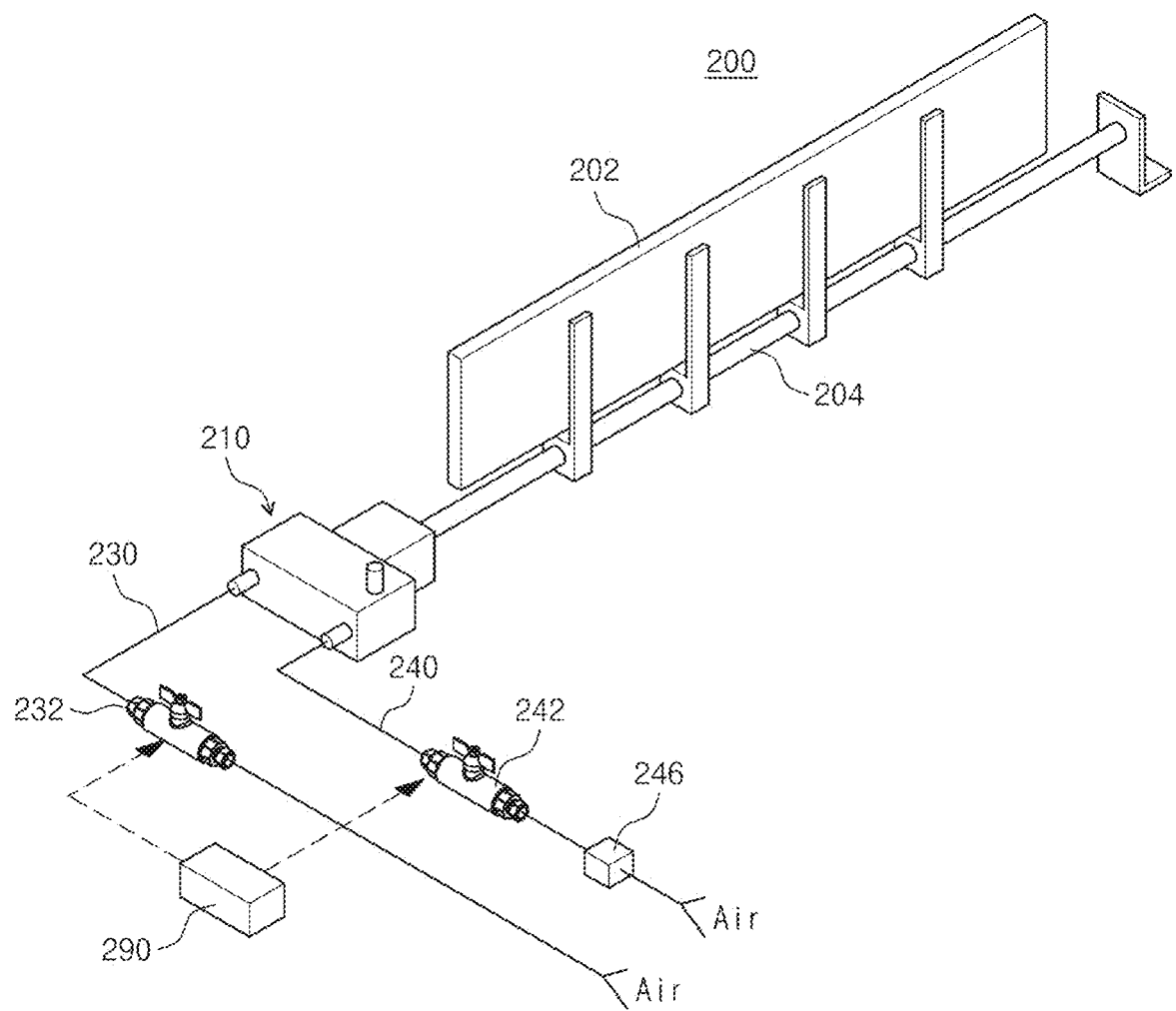
FIG. 3 is a view illustrating a shutter apparatus illustrated in FIG. 2.
Figure 4:
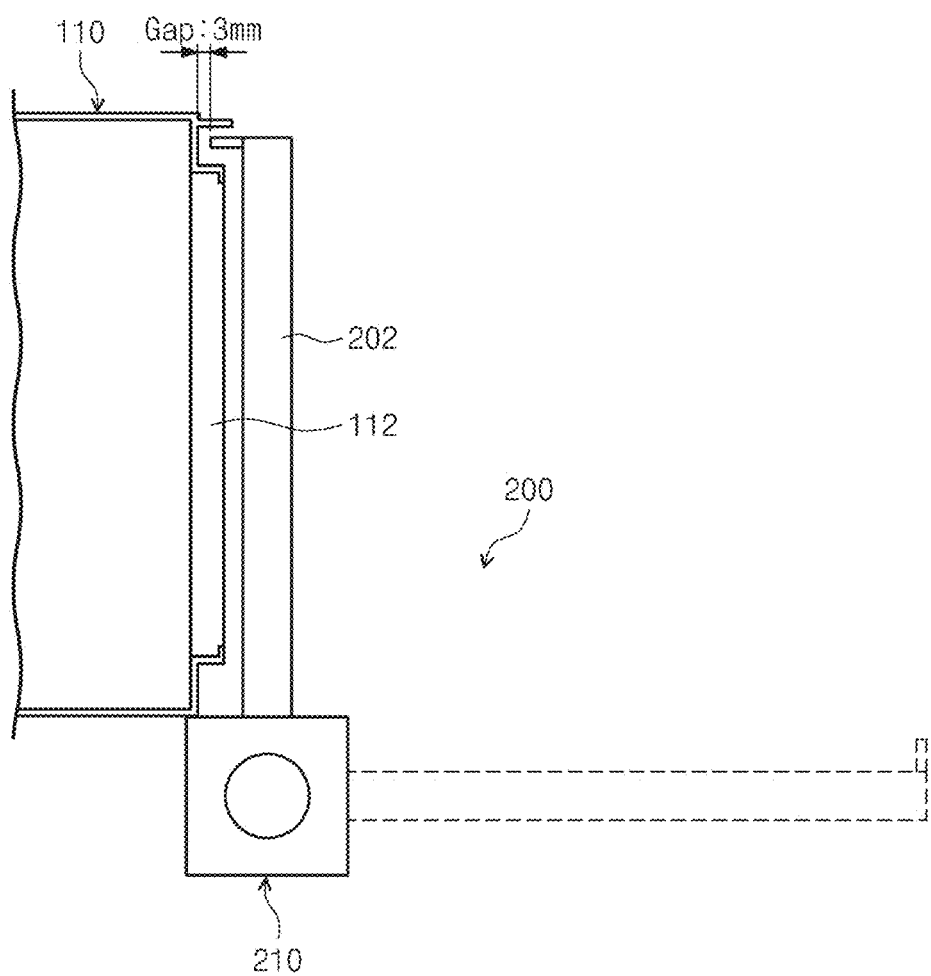
FIG. 4 is a schematic view illustrating an opened state and a closed state of the shutter apparatus.
Figure 5:
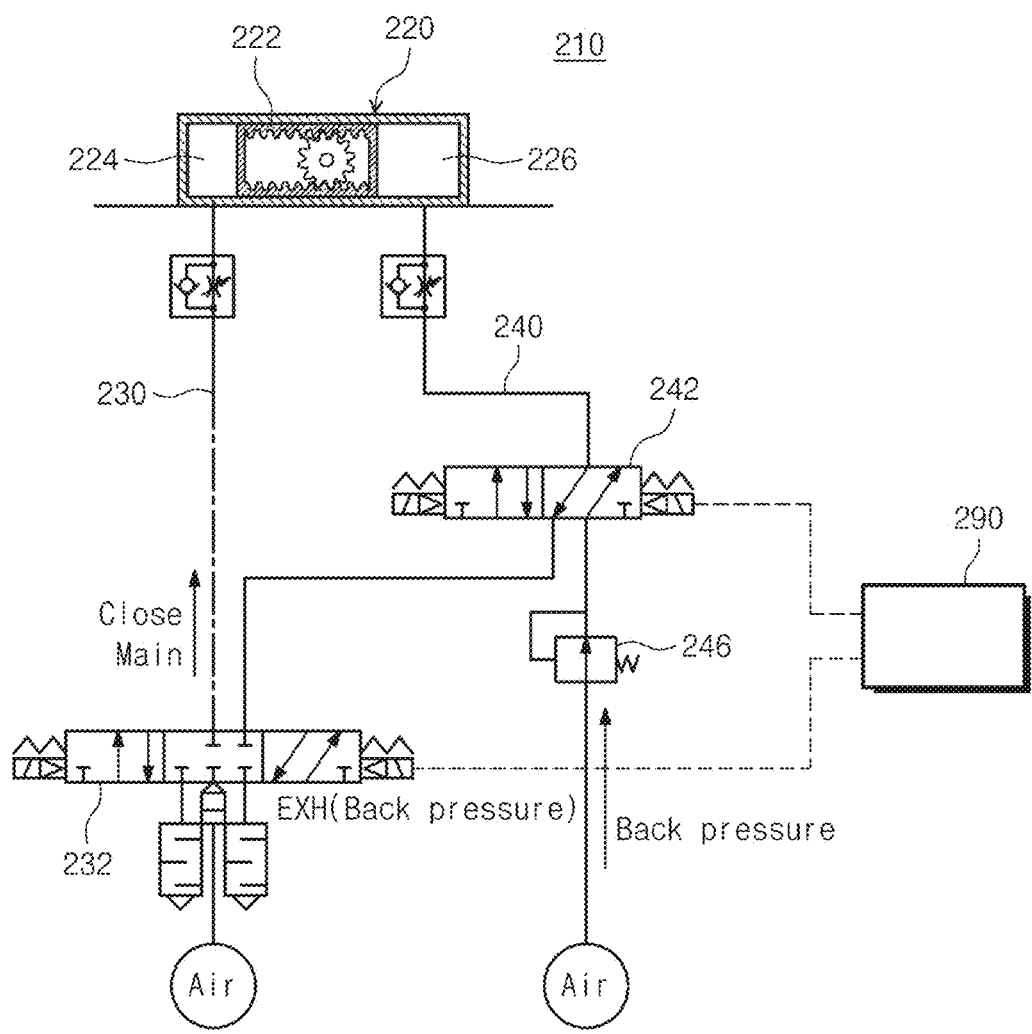
FIG. 5 is a diagram illustrating a shutter driver.

FIG. 3 is a view illustrating a shutter apparatus illustrated in FIG. 2. FIG. 4 is a schematic view illustrating an opened state and a closed state of the shutter apparatus. FIG. 5 is a diagram illustrating a shutter driver.

Referring to FIGS. 3 to 5, the shutter apparatus 200 may include a shutter 202, a rotary shaft 204, and a shutter driver 210.

The shutter 202 may open and close an opening 112 of the baking chamber 110 through a rotation thereof. The shutter 202 maintains a specific interval (for example, 3 mm) from the baking chamber 110 in a closed state. Exterior air is introduced through the gap, and the exterior air introduced through the gap between the opening 112 and the shutter 202 is exhausted through an exhaust hole (not illustrated) formed on a side wall of the baking chamber 110 that is opposite to the opening 112. Accordingly, horizontal air flows are formed in the baking chamber 110, and fumes generated in the process of baking the substrate is exhausted along the air flows.

The shutter driver 210 may include a cylinder 220 that opens and closes the shutter 202. As an example, the cylinder 220 may be a rack-pinion type rotary cylinder that converts a linear thrust obtained by a piston into a rotary torque.

The shutter driver 210 may include the cylinder 220, a first pneumatic pressure line 230, a second pneumatic pressure line 240, a first valve 232, a second valve 242, a regulator 246, and a controller 290.

The cylinder 220 may include a positive pressure chamber 224 that accommodates a piston 222 such that the piston 222 is moved forwards and rearwards in an axial direction thereof, is formed on one side of the piston 222, and through which a pneumatic pressure for closing the shutter 202 is introduced, and a back pressure chamber 226 that is formed on an opposite side thereof and through which a pneumatic pressure for opening the shutter 202 is introduced, the piston 222 being interposed between the positive pressure chamber 224 and the back pressure chamber 226. A rack-pinion structure is applied to the piston 222 to convert a linear movement into a rotational movement, and the rotary shaft 204 may be connected to the pinion.

The first pneumatic pressure line 230 provides the positive pressure for closing the shutter 202, to the positive pressure chamber 224. The first valve 232 is installed in the first pneumatic pressure line 230. The first valve 232 is controlled by the controller 290.

The second pneumatic pressure line 240 provides the back pressure for opening the shutter 202, to the back pressure chamber 226. The second valve 242 and the regulator 246 are installed in the second pneumatic pressure line 240. The second valve 242 is controlled by the controller 290.

The controller 290 may control the first and second valves 232 and 242 such that the positive pressure and the back pressure are provided together during the closing operation of the shutter 202. Further, the controller 290 may control the first and second valves 232 and 242 such that the back pressure is provided during the opening operation of the shutter 202.

As described above, the shutter apparatus 200 of the inventive concept may control a cylinder driving angle only by adjusting pressure during the closing operation of the shutter 202. Conventionally, in order to avoid an interference (contact) between the shutter 202 and the chamber 110 due to a backlash in the shutter driver 210, a gap of 5 mm or more is maintained during assembly setting when the shutter driver 210 is assembled, or an shutter operation time is added. However, in the inventive concept, a backlash may be restrained by using an air cushion phenomenon by providing pneumatic pressures (a back pressure) that are applied in opposite directions at a specific time or at a specific location during the closing operation of the shutter 202.

Figure 6:
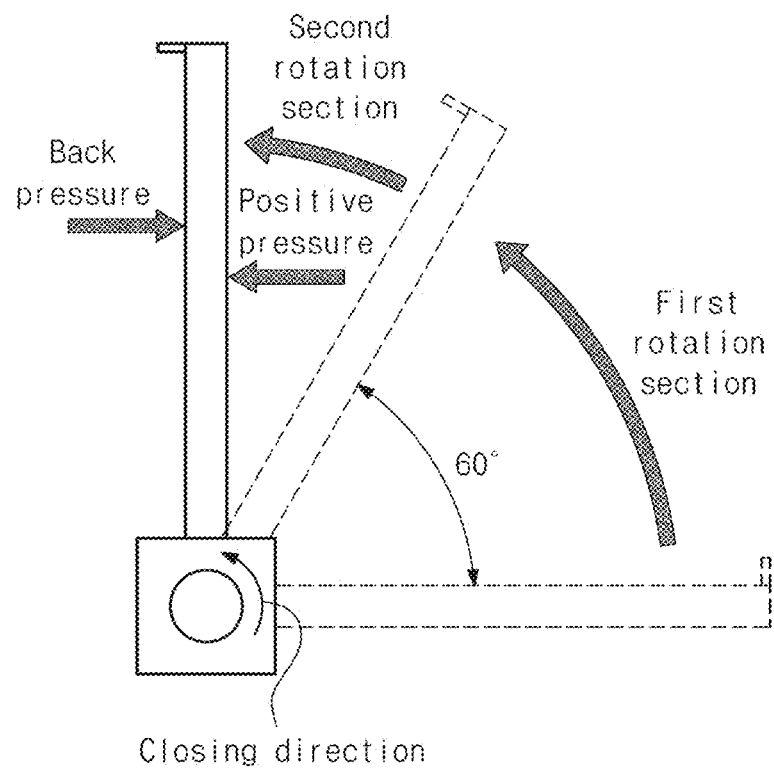
FIG. 6 is a view illustrating a closing operation of a shutter.

FIG. 6 is a view illustrating a closing operation of a shutter.

As in FIGS. 5 and 6, the controller may control a pneumatic pressure provided to the cylinder 220 such that, when the shutter 202 is rotated from an opening location to a closing location, a rotational speed of the shutter 202 in a first rotation section including the opening location and a rotational speed of the shutter 202 in a second rotation section including the closing location are different. It is preferable that the first rotation section has a rotation range that is larger than the second rotation section. For example, the rotational speed of the shutter 202 in the second rotation section is lower than the rotational speed of the shutter 202 in the first rotation section. The rotational speed of the shutter 202 in the second rotation section is lower because the back pressure in addition to the positive pressure is provided to the cylinder 220 in the second rotation section.

That is, the controller 290 controls the second valve 242 such that the back pressure is provided to the cylinder 220 through the second pneumatic pressure line 240 when the shutter 202 enters the second rotation section. Meanwhile, the regulator 246 installed in the second pneumatic pressure line 240 is configured such that the back pressure supplied to the back pressure chamber 226 is lower than the positive pressure supplied to the positive pressure chamber 224.

The first rotation section and the second rotation section may be set by a period of time during the closing operation of the shutter 202.

Figure 7:
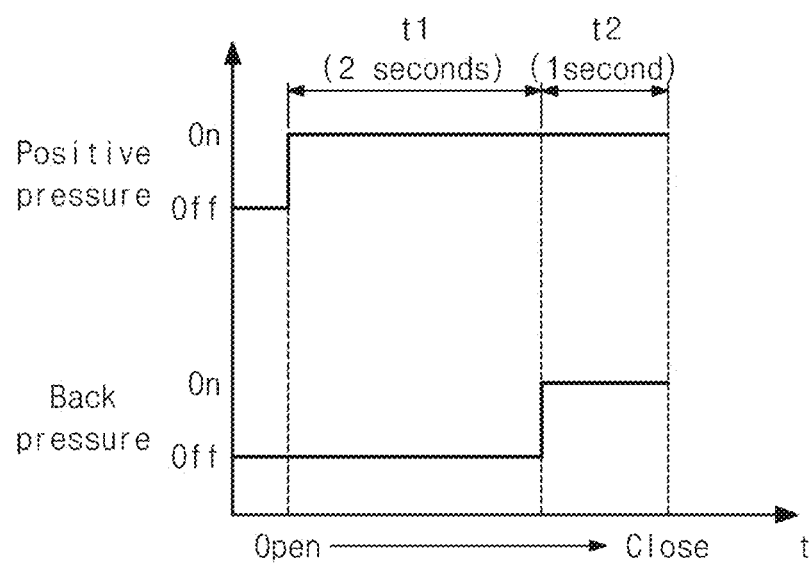
FIG. 7 is a graph depicting supply of a positive pressure and a back pressure provided to a cylinder during a shutter closing operation.

FIG. 7 is a graph depicting supply of a positive pressure and a back pressure provided to a cylinder during a shutter closing operation.

As in FIG. 7, the controller 290 may control the first valve 232 such that the positive pressure is supplied to the positive pressure chamber 224 for the closing operation of the shutter 202, and may control the second valve 242 such that the back pressure is supplied to the back pressure chamber 226 after a specific period of time. Preferably, it is preferable that, during the closing operation of the shutter 202, a period of time (t2), for which the positive pressure and the back pressure are simultaneously provided to the cylinder 220, is shorter than a period of time (t1), for which only the positive pressure is provided to the cylinder 220. For example, when the closing time period of the shutter 202 is a total of 3 seconds, 2 seconds may be allocated to the supply of only the positive pressure, and the remaining 1 second may be allocated to the simultaneous supply of the positive pressure and the back pressure.

As another measure, the controller 290 may control the first valve 232 such that a pneumatic pressure is supplied to the positive pressure chamber 224 for the closing operation of the shutter 202, and may control the second valve 242 such that a pneumatic pressure is supplied to the back pressure chamber 226 when the shutter 202 is located at a specific angle. The measure may additionally require a sensor (not illustrated) that checks whether the shutter 202 reaches a preset angle. It is preferable that, during the closing operation of the shutter 202, a rotation range of the shutter 202 for a period of time (t2), for which the positive pressure and the back pressure are simultaneously provided to the cylinder 220, is shorter than a rotation range of the shutter 202 for a period of time (t1), for which only the positive pressure is provided to the cylinder 220.

According to the embodiments of the inventive concept, a backlash may be restrained by using an air cushion phenomenon by providing pneumatic pressures (a back pressure) that are applied in opposite directions at a specific time or at a specific location during the closing operation of the shutter.

The effects of the inventive concept are not limited to the above-mentioned effects, and the unmentioned effects can be clearly understood by those skilled in the art to which the inventive concept pertains from the specification and the accompanying drawings.

The above description is a simple exemplification of the technical spirits of the inventive concept, and the inventive concept may be variously corrected and modified by those skilled in the art to which the inventive concept pertains without departing from the essential features of the inventive concept. Accordingly, the embodiments disclosed in the inventive concept is not provided to limit the technical spirits of the inventive concept but provided to describe the inventive concept, and the scope of the technical spirits of the inventive concept is not limited by the embodiments. Accordingly, the genuine technical scope of the inventive concept should be construed by the attached claims, and all the technical spirits within the equivalent ranges fall within the scope of the inventive concept.

What is claimed is:

1. A substrate treating apparatus comprising:
a process chamber having an opening;
a shutter configured to open and close the opening through a rotation thereof while maintaining a gap with respect to the process chamber while closed; and
a shutter driver having a cylinder configured to open and close the shutter,
wherein the shutter driver includes:
a controller configured to control a pneumatic pressure provided to the cylinder such that, when the shutter is rotated from an opening location to a closing location, a rotational speed of the shutter in a first rotation section including the opening location and a rotational speed of the shutter in a second rotation section including the closing location are different,
wherein the shutter driver includes:
the cylinder;
a first pneumatic pressure line configured to provide a positive pressure for closing the shutter to the cylinder;
a second pneumatic pressure line configured to provide a back pressure for opening the shutter to the cylinder;
a first valve provided in the first pneumatic pressure line;
a second valve provided in the second pneumatic pressure line; and
the controller configured to control the first valve and the second valve,
wherein the controller controls the second valve to provide the back pressure to the cylinder through the second pneumatic pressure line when the shutter enters the second rotation section,
the gap is 3 mm, and the process chamber has an exhaust hole on a sidewall of the process chamber opposite to the opening, the exhaust hole configured to exhaust air introduced to the process chamber through the gap.

2. The substrate treating apparatus of claim 1, wherein the first rotation section has a rotation section that is larger than the second rotation section.

3. The substrate treating apparatus of claim 1, wherein the rotational speed of the shutter in the second rotation section is lower than the rotational speed of the shutter in the first rotation section.

4. The substrate treating apparatus of claim 1, wherein the shutter driver further includes:
a regulator installed in the second pneumatic pressure line.

5. The substrate treating apparatus of claim 4, wherein the regulator is configured such that the back pressure supplied to a back pressure chamber is lower than the positive pressure supplied to a positive pressure chamber.

6. The substrate treating apparatus of claim 1,
wherein the cylinder is a rack-pinion type rotary cylinder configured to convert a linear thrust obtained by a piston into a rotary torque.

7. The substrate treating apparatus of claim 6, wherein the controller is configured to supply the positive pressure and the back pressure during a closing operation of the shutter, and to provide the back pressure during an opening of the shutter.

8. A substrate treating apparatus comprising:
a process chamber having an opening;
a shutter configured to open and close the opening through a rotation thereof while maintaining a gap with respect to the process chamber while closed; and
a shutter driver having a cylinder configured to open and close the shutter,
wherein the shutter driver further includes:
the cylinder having a positive pressure chamber accommodating a piston such that the piston is moved forwards and rearwards in an axial direction thereof, formed on one side of the piston, and through which a pneumatic pressure for closing the shutter is introduced, and a back pressure chamber formed on an opposite side thereof and through which a pneumatic pressure for opening the shutter is introduced,
a first pneumatic pressure line configured to provide a positive pressure for closing the shutter to the positive pressure chamber;
a second pneumatic pressure line configured to provide a back pressure for opening the shutter to the back pressure chamber;
a first valve provided in the first pneumatic pressure line;
a second valve provided in the second pneumatic pressure line; and
a controller configured to control the first and second valves such that the positive pressure and the back pressure are provided together during closing operation of the shutter,
wherein the controller controls the first valve such that a pneumatic pressure is supplied to the positive pressure chamber for the closing operation of the shutter, and controls the second valve such that a pneumatic pressure is supplied to the back pressure chamber when the shutter is located at a specific angle,
wherein a range, in which the shutter is rotated for a period of time, for which the positive pressure and the back pressure are simultaneously provided to the cylinder during the closing operation of the shutter, is shorter than a range, in which the shutter is rotated for a period of time, for which only the positive pressure is provided to the cylinder,
the gap is 3 mm, and
the process chamber has an exhaust hole on a sidewall of the process chamber opposite to the opening, the exhaust hole configured to exhaust air introduced to the process chamber through the gap.

9. The substrate treating apparatus of claim 8, wherein the shutter driver further includes:
a regulator installed in the second pneumatic pressure line.

10. The substrate treating apparatus of claim 8, wherein the controller controls the first valve such that the positive pressure is supplied to the positive pressure chamber for the closing operation of the shutter, and controls the second valve such that the back pressure is supplied to the back pressure chamber after a specific period of time.

11. The substrate treating apparatus of claim 10, wherein a period of time, for which the positive pressure and the back pressure are simultaneously provided to the cylinder during the closing operation of the shutter, is shorter than a period of time, for which only the positive pressure is provided to the cylinder.

12. The substrate treating apparatus of claim 8, wherein the controller controls the positive pressure and the back pressure to be supplied to the cylinder such that, when the shutter is rotated from an opening location to a closing location, a rotational speed of the shutter in a first rotation section including the opening location is higher than a rotational speed of the shutter in a second rotation section including the closing location.

13. The substrate treating apparatus of claim 12, wherein the controller controls the first valve and the second valve such that only the positive pressure is provided in the first rotation section and the positive pressure and the back pressure are simultaneously provided in the second rotation section.

14. The substrate treating apparatus of claim 8, wherein the back pressure supplied to the back pressure chamber is lower than the positive pressure supplied to the positive pressure chamber.

15. A shutter apparatus configured to open and close access to a process chamber, the shutter apparatus comprising:
a shutter configured to open and close an opening through a rotation thereof while maintaining a gap with respect to the opening while closed; and
a shutter driver having a cylinder configured to open and close the shutter,
wherein the shutter driver further includes:
the cylinder having a positive pressure chamber accommodating a piston such that the piston is moved forwards and rearwards in an axial direction thereof, formed on one side of the piston, and through which a pneumatic pressure for closing the shutter is introduced, and a back pressure chamber formed on an opposite side thereof and through which a pneumatic pressure for opening the shutter is introduced,
a first pneumatic pressure line configured to provide a positive pressure for closing the shutter to the positive pressure chamber;
a second pneumatic pressure line configured to provide a back pressure for opening the shutter to the back pressure chamber;
a first valve provided in the first pneumatic pressure line;

a second valve provided in the second pneumatic pressure line;
a regulator provided in the second pneumatic pressure line; and
a controller configured to control the first and second valves such that the positive pressure and the back pressure are provided together during closing operation of the shutter,
wherein the controller controls the first valve and the second valve such that only the positive pressure is provided at an initial stage for the closing operation of the shutter, and thereafter, the positive pressure and the back pressure are provided simultaneously,
wherein the controller controls the first valve and the second valve such that a period of time, for which the positive pressure and the back pressure are simultaneously provided to the cylinder, is shorter than a period of time, for which only the positive pressure is provided to the cylinder,
the gap is 3 mm, and
the process chamber has an exhaust hole on a sidewall of the process chamber opposite to the opening, the exhaust hole configured to exhaust air introduced to the process chamber through the gap.

16. The shutter apparatus of claim 15, wherein the regulator is configured such that the back pressure supplied to the back pressure chamber is lower than the positive pressure supplied to the positive pressure chamber.

* * * * *